United States Patent [19]
Jeong

[11] Patent Number: 6,084,459
[45] Date of Patent: Jul. 4, 2000

[54] VOLTAGE LEVEL SHIFTING CIRCUIT

[75] Inventor: Jae-Hong Jeong, Seoul, Rep. of Korea

[73] Assignee: LG Semicon Co., Ltd., Choogcheongbuk-Do, Rep. of Korea

[21] Appl. No.: 08/953,510

[22] Filed: Oct. 17, 1997

[30] Foreign Application Priority Data

Nov. 28, 1996 [KR]  Rep. of Korea ...................... 96/58666

[51] Int. Cl.[7] ....................................................... H03L 5/00
[52] U.S. Cl. ............................ 327/333; 327/219; 326/68; 326/81
[58] Field of Search ................................. 327/333, 52, 65, 327/219, 436, 437, 55; 326/17, 68, 80, 81, 83, 121

[56] References Cited

U.S. PATENT DOCUMENTS

| | | | |
|---|---|---|---|
| 4,695,744 | 9/1987 | Giordano | 327/333 |
| 4,845,381 | 7/1989 | Cuevas | 327/333 |
| 5,698,993 | 12/1997 | Chow | 326/81 |

*Primary Examiner*—Timothy P. Callahan
*Assistant Examiner*—Minh Nguyen
*Attorney, Agent, or Firm*—Morgan, Lewis & Bockius LLP

[57] ABSTRACT

An improved voltage level shifting circuit which is capable of increasing a level shifting speed and reducing a current consumption and layout area by decreasing a pull-up capacity of the pull-up PMOS transistors in a side in which a voltage level is shifted to a low level and increasing a pull-up capacity through the NMOS transistors in a side in which a voltage level is shifted to a high level. The voltage level shifting circuit includes a pull-up PMOS transistor and a pull-down NMOS transistor connected in series between a voltage Vpp terminal and a voltage Vss terminal and having a common drain which acts a first voltage terminal, a pull-up PMOS transistor and a pull-down NMOS transistor connected in series between the voltage Vpp terminal and the voltage Vss terminal, configured symmetrically with respect to the pull-up PMOS transistor and pull-down NMOS transistor, and having a common drain which acts as a second voltage terminal, a first conductive type MOS transistor a source of which is connected with a gate of the pull-up PMOS transistor and the second voltage terminal, respectively and a gate of which is connected with an input terminal, and a second conductive type MOS transistor a source of which is connected with a gate of the pull-up PMOS transistor and the first voltage terminal, respectively, and a gate of which is connected with the input terminal through an inverter.

13 Claims, 3 Drawing Sheets

VOLTAGE LEVEL SHIFTING CIRCUIT

BACKGROUND OF THE INVENTION

1. Field of the Invention

The present invention relates to a voltage level shifting circuit, and in particular to an improved voltage level shifting circuit which is capable of increasing a level shifting speed and reducing a current consumption and a layout area.

2. Description of the Conventional Art

The conventional voltage level shifting circuit is disclosed in U.S. Pat. No. 4,845,381.

As shown in FIG. 1, the conventional voltage level shifting circuit includes a PMOS transistor 10 and a first inverter 11 which are connected in series between a Vpp terminal and a Vss terminal, and a PMOS transistor 12 and a second inverter 13 which are connected in series between the Vpp terminal and Vss terminal and connected in parallel with the PMOS transistor 10 and the first inverter 11.

The first inverter 11 includes a pull-up PMOS transistor PM1 and a pull-down NMOS transistor NM1 the gate of each of which receives an input signal Vin, and the first voltage terminal V1 is connected with the gate of the PMOS transistor 12.

The second inverter 13 includes a pull-up PMOS transistor PM2 and a pull-down NMOS transistor NM2 the gate of each of which receives an inverted input signal Vin, and the second voltage terminal V2 is connected with the gate of the PMOS transistor 10.

The operation of the conventional level shifting circuit will now be explained with reference to FIG. 1.

First, when a voltage Vss is inputted through the input terminal Vin, the voltage Vss is inputted into the first inverter 11, and a voltage Vdd is inputted into the second inverter 13.

Subsequently, the pull-up PMOS transistor PMI of the first inverter 11 and the pull-down NMOS transistor NM2 of the second inverter 13 are fully turned on, and the pull-up PMOS transistor PM2 of the second inverter 13 is slightly turned on.

Therefore, the driving capacity of the pull-down NMOS transistor NM2 is increased to a predetermined level which is higher than the driving capacity of the pull-down PMOS transistor PM2, the second voltage terminal V2 of the second inverter 13 becomes a voltage Vss, and the first voltage terminal V1 of the first inverter 11 becomes a voltage Vpp.

In addition, since the PMOS transistor 12 is turned off by the voltage Vpp of the first voltage terminal V1, the final output voltage Vout becomes a voltage Vss.

If a voltage Vdd which is lower than Vpp, is applied to the first inverter 11, and a signal corresponding to Vss is inputted into the second inverter 13, the pull-up PMOS transistor PM1 is slightly turned on, and the pull-down NMOS transistor NM1 is fully turned on, so that the driving capacity of the pull-down NMOS transistor NM1 is increased rather than the driving capacity of the pull-up PMOS transistor PM2.

Therefore, the voltage at the first voltage terminal V1 of the first inverter 11 becomes a voltage Vss, and the PMOS transistor 12 is turned on by the voltage Vss of the first inverter 11, whereby the voltage Vpp is applied to the second voltage terminal V2 of the second inverter 13.

At this time, the PMOS transistor 10 is turned off by the voltage Vpp of the second voltage terminal V2, so that the PMOS transistor 10 does not apply the power to the first voltage terminal V1.

Subsequently, the voltage at the first voltage terminal V1 of the first inverter 11 becomes a voltage Vss, and the PMOS transistor 12 is turned on by the voltage Vss, so that the output voltage Vout becomes a Vpp level.

Namely, the conventional voltage level shifting circuit receives a voltage Vdd and outputs a voltage Vpp (Vpp>Vdd).

However, in the conventional voltage level shifting circuit, since the PMOS transistor 10 and the pull-up PMOS transistor PM1 each having a smaller driving capacity and the PMOS transistor 12 and the pull-up PMOS transistor PM2 are connected in series, the size (W/L: Width/Length) of the PMOS transistors should be increased in order to obtain a sufficient driving capacity.

Therefore, as the sizes of the PMOS transistors are increased, the layout area of the level shifter is disadvantageously increased.

In addition, since a level shifting from a low level to a high level is performed through the PMOS transistor 12 and the pull-up PMOS transistor PM2 each having a smaller driving capacity, it is impossible to obtain a fast level shifting speed.

SUMMARY OF THE INVENTION

Accordingly, it is an object of the present invention to provide a voltage level shifting circuit which overcomes the aforementioned problem encountered in the conventional art.

It is another object of the present invention to provide an improved voltage level shifting circuit which is capable of increasing a level shifting speed and reducing a current consumption and layout area by decreasing a pull-up capacity of the pull-up PMOS transistors in a side in which a voltage level is shifted to a low level and increasing a pull-up capacity through the NMOS transistors in a side in which a voltage level is shifted to a high level.

To achieve the above objects, according to a first embodiment of the present invention, there is provided a voltage level shifting circuit which includes a pull-up PMOS transistor and a pull-down NMOS transistor connected in series between a voltage Vpp terminal and a voltage Vss terminal and having a common drain which acts a first voltage terminal, a pull-up PMOS transistor and a pull-down NMOS transistor connected in series between the voltage Vpp terminal and the voltage Vss terminal, configured symmetrically with respect to the pull-up PMOS transistor and pull-down NMOS transistor, and having a common drain which acts as a second voltage terminal, a first conductive type MOS transistor a source of which is connected with a gate of the pull-up PMOS transistor and the second voltage terminal, respectively and a gate of which is connected with an input terminal, and a second conductive type MOS transistor a source of which is connected with a gate of the pull-up PMOS transistor and the first voltage terminal, respectively, and a gate of which is connected with the input terminal through an inverter.

To achieve the above objects, according to a second embodiment of the present invention, there is provided a voltage level shifting circuit which includes a NMOS transistor, a pull-up PMOS transistor, and a pull-down NMOS transistor connected in series between a voltage Vpp terminal and a voltage Vss terminal and having a common drain which acts as a first voltage terminal, a NMOS transistor, a pull-up PMOS transistor, and a pull-down NMOS transistor connected in series between the voltage Vpp terminal and the voltage Vss terminal and configured symmetrically with respect to the pull-up PMOS transistor and the pull-down NMOS transistor and having a common drain which acts as a second voltage terminal, a first conductive MOS transistor for increasing a level of the second voltage terminal during a level shifting and decreasing a driving capacity of the pull-up PMOS transistor, and a second conductive type MOS transistor for increasing a level of the first voltage terminal during a level shifting and decreasing a driving capacity of the pull-up PMOS transistor.

To achieve the above objects, according to a third embodiment of the present invention, there is provided a voltage level shifting circuit which includes a pull-up PMOS transistor, a PMOS transistor, and a pull-down NMOS transistor connected in series between a voltage Vpp terminal and a voltage Vss terminal and having a common drain which acts as a first voltage terminal, a pull-up PMOS transistor, a PMOS transistor, and a pull-down NMOS transistor connected in series between the voltage Vpp terminal and the voltage Vss terminal and configured symmetrically with respect to the pull-up PMOS transistor, the PMOS transistor, and the pull-down NMOS transistor and having a common train which acts as a second voltage terminal, a first conductive type MOS transistor for increasing a voltage level of the second voltage terminal during a level shifting and decreasing a driving capacity of the pull-up PMOS transistor, and a second conductive type MOS transistor for increasing a voltage level of the first voltage terminal during a level shifting and decreasing a driving capacity of the pull-up PMOS transistor.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
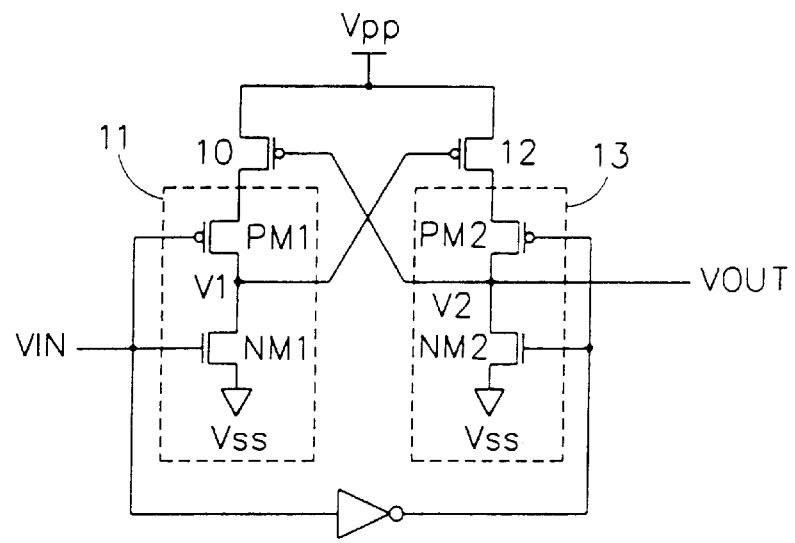
FIG. 1 is a circuit diagram illustrating a conventional voltage level shifting circuit.
Figure 2:
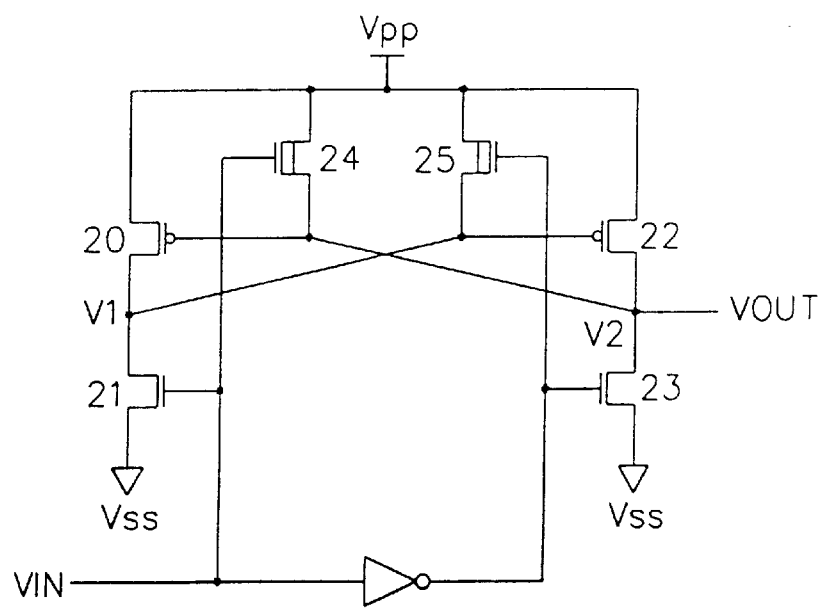
FIG. 2 is a circuit diagram illustrating a voltage level shifting circuit according to a first embodiment of the present invention.

As shown in FIG. 2, the voltage level shifting circuit according to a first embodiment of the present invention includes a pull-up PMOS transistor 20 and a pull-down NMOS transistor 21 which are connected in series between a voltage Vpp terminal and a voltage Vss terminal, a pull-up PMOS transistor 22 and a pull-down NMOS transistor 23 which are connected in series between a voltage Vpp terminal and a voltage Vss terminal and are symmetrical with respect to the connection of the pull-up PMOS transistor 20 and the pull-down NMOS transistor 21, an NMOS transistor 24, having a low threshold voltage Vthl, the source of which is connected with the gate of the pull-up PMOS transistor 20 and a second voltage terminal V2, respectively, and the gate of which is connected with an input terminal Vin, and an NMOS transistor 25, having a low threshold voltage Vthl, the source of which is connected with the gate of the pull-up PMOS transistor 22 and the first voltage terminal V1, respectively, the gate of which is connected with the input terminal Vin through an inverter.

The operation of the thusly constituted voltage level shifting circuit according to the present invention will now be explained with reference to FIG. 2.

First, when a voltage Vss is inputted through the input terminal Vin, the NMOS transistor 25 is turned on, and a voltage Vdd-Vthl at the source of the NMOS transistor 25 is applied to the gate of the pull-up PMOS transistor 22 and the first voltage terminal V1, respectively.

At this time, since the pull-up capacity of the pull-up PMOS transistor 22 which receives a voltage Vdd-Vthl is decreased rather than the pull-down capacity of the pull-down NMOS transistor 23 which receives a voltage Vdd, the voltage at the second voltage terminal V2 becomes a voltage Vss.

Namely, the NMOS transistor 25 increases the initial voltage of the first voltage terminal V1 and decreases the pull-up capacity of the pull-up PMOS transistor 22.

In addition, the pull-up PMOS transistor 20 is turned on by the voltage Vss of the second voltage terminal V2, the voltage is increased from "Vdd-Vthl" to Vpp at the first voltage terminal V1. The pull-up PMOS transistor 22 is fully turned off by the voltage Vpp, and the second voltage terminal maintains the voltage Vss.

Thereafter, when the input signal Vin is increased from Vss to Vdd, the NMOS transistor 24 and the pull-down NMOS transistor 21 are turned on, and the voltage Vdd-Vthl at the source of the NMOS transistor 24 is applied to the gate of the pull-up PMOS transistor 20 and the second voltage terminal V2, respectively.

At this time, since the pull-up capacity of the pull-up PMOS transistor 20 which receives the voltage Vdd-Vthl is decreased rather than the pull-down capacity of the pull-down NMOS transistor 21 which receives the voltage Vdd, the voltage at the first voltage terminal V1 becomes the voltage Vss.

Namely, the NMOS transistor 24 increases the initial voltage of the second voltage terminal V2 and decreases the pull-up capacity of the pull-up PMOS transistor 20.

In addition, the pull-up PMOS transistor 22 is turned on by the voltage Vss of the first voltage terminal V1, and the voltage at the second voltage terminal V2 and the gate voltage of the pull-up PMOS transistor 20 are increased from "Vdd-Vthl" to Vpp.

Therefore, the voltage at the second voltage terminal V2 becomes the voltage Vpp and as the pull-up PMOS transistor 20 is fully turned off, the voltage at the first voltage terminal V1 becomes the voltage Vss.

Namely, in the first embodiment of the present invention, in the side in which a voltage level is shifted to a high level, namely, in the side of the second voltage terminal V2, only one pull-up PMOS transistor is connected unlike two PMOS transistors are connected therein in the conventional art. In addition, in the side in which a voltage level is shifted to a low level, namely, in the side of the first voltage terminal V1, the pull-up capacity of the pull-up PMOS transistor is decreased by the NMOS transistor having a low threshold voltage, thus increasing a level shifting speed.

Figure 3:
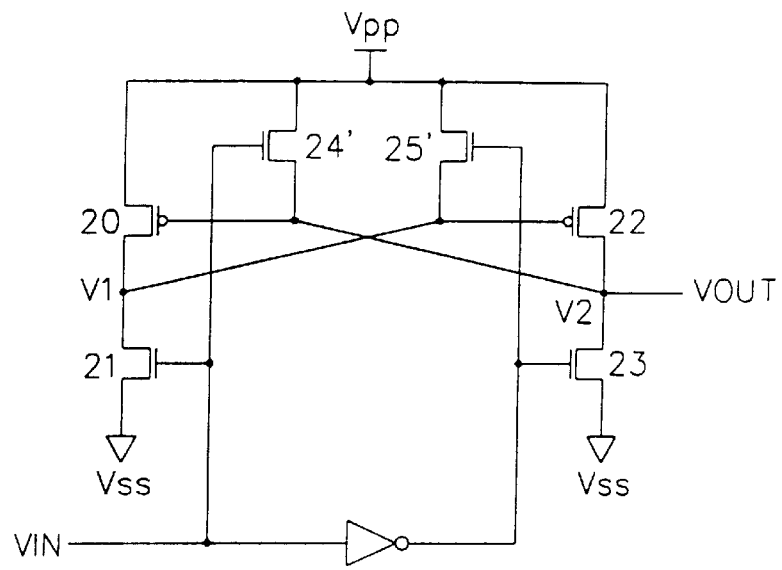
FIG. 3 is a circuit diagram illustrating a voltage level shifting circuit according to a second embodiment of the present invention.

As shown in FIG. 3, in the second embodiment of the present invention, the NMOS transistors 24 and 25 each having a low threshold voltage Vthl of the first embodiment of the present invention are replaced with NMOS transistors 24' and 25' each having a common threshold voltage which is greater than the low threshold voltage Vthl.

Figure 4:
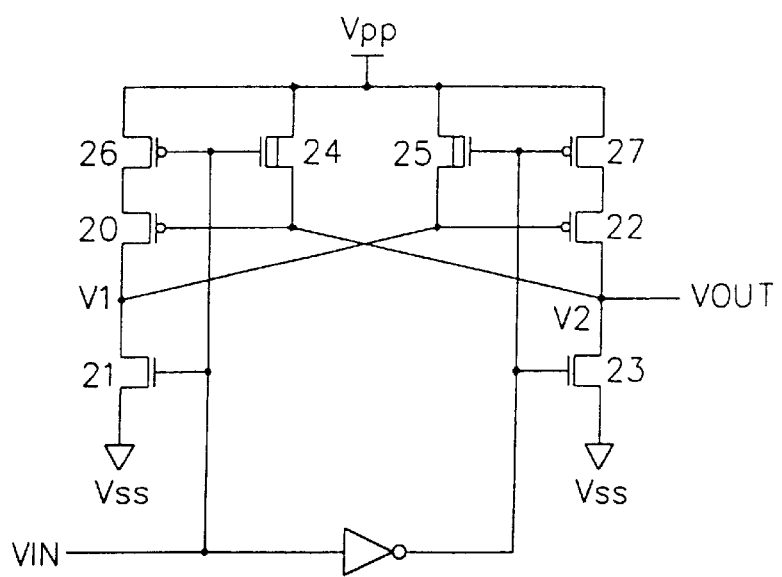
FIG. 4 is a circuit diagram illustrating a voltage level shifting circuit according to a third embodiment of the present invention.

As shown in FIG. 4, in the third embodiment of the present invention, additionally to the construction of the second embodiment of the present invention, PMOS transistors 26 and 27, the gates of which are connected with the gate of the NMOS transistor 24 or the gate of the NMOS transistor 25, are connected between the voltage Vpp terminal and the pull-up PMOS transistor 20 or the pull-up PMOS transistor 22.

Namely, in the third embodiment of the present invention, when the source voltage Vdd-Vthl of the NMOS transistors 24 and 25 is inputted into the gates of the pull-up PMOS transistors 20 and 22, respectively, the pull-up capacities of the pull-up PMOS transistors 20 and 22 are more increased by slightly turning on the PMOS transistors 26 and 27 in accordance with an externally applied signal for limiting a current flow, whereby a level shifting speed is increased and a current consumption is reduced.

Figure 5:
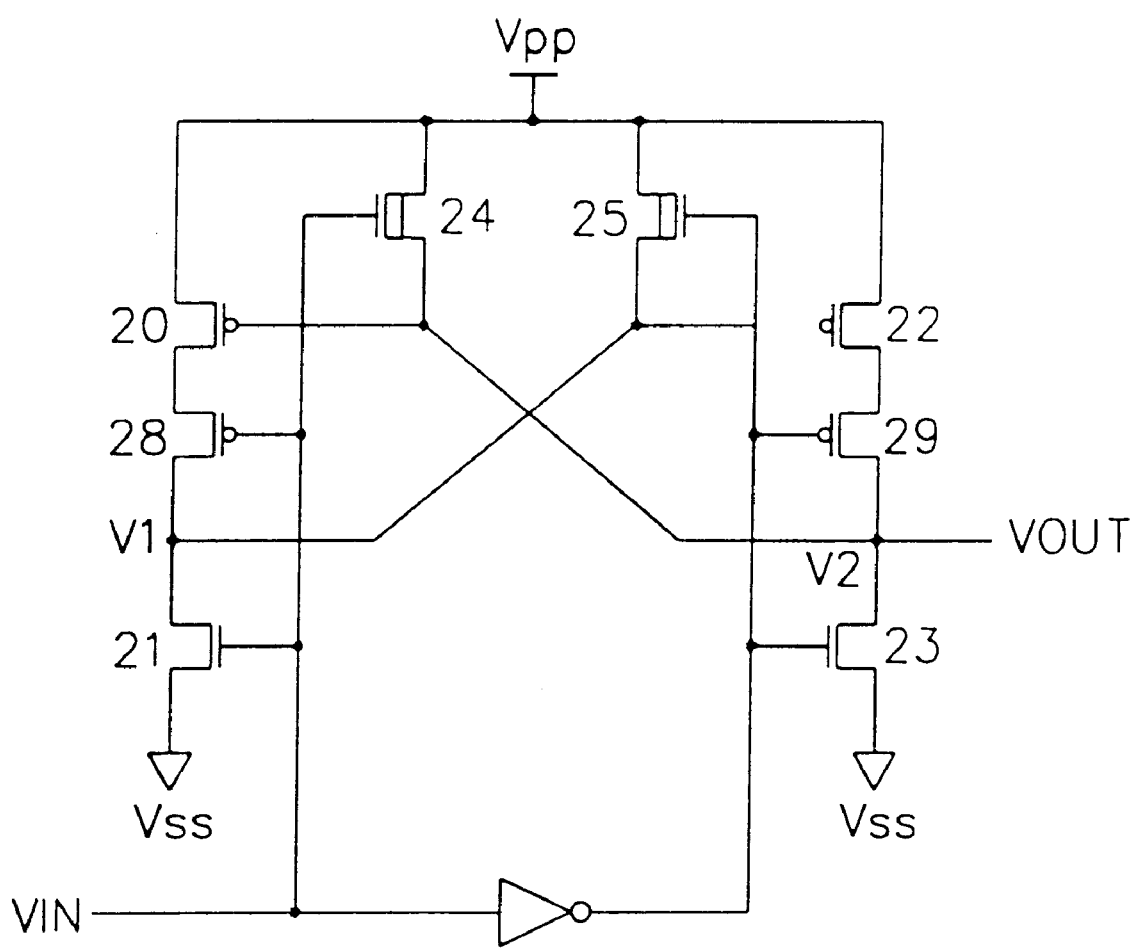
FIG. 5 is a circuit diagram illustrating a voltage level shifting circuit according to a fourth embodiment of the present invention.

In addition, as shown in FIG. 5, in the fourth embodiment of the present invention, additionally to the construction of the first embodiment of the present invention shown in FIG. 2, a PMOS transistor 28 the gate of which is connected with the input terminal Vin, is connected between the pull-up PMOS transistor 20 and the pull-down NMOS transistor 21, and a PMOS transistor 29 the gate of which is connected with the input terminal Vin through the inverter, is connected between the pull-up PMOS transistor 22 and the pull-down NMOS transistor 23.

In the fourth embodiment of the present invention, the PMOS transistors 28 and 29 are slightly turned on, thus limiting a current flow, so that in a side in which a voltage level is shifted to a low level, the current flow from the pull-up PMOS transistors 20 and 22 to the first and second voltage terminals V1 and V2, and in a side in which a voltage level is shifted to a high level, the pull-up capacity of the pull-up PMOS transistors 20 and 22 are decreased.

As described above, in the present invention, in a side in which a voltage level is shifted to a high level, the voltage level shifting is performed by using one pull-up PMOS transistor, and in a side in which a voltage level is shifted to a low level, the pull-up capacity of the pull-up PMOS transistor is decreased by the NMOS transistor having a low threshold voltage or an externally applied signal, whereby the level shifting speed is increased and a current consumption is reduced.

In addition, since a level shifting from a low level to a high level is performed by one PMOS transistor, it is possible to significantly reduce the layout area.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A voltage level shifting circuit, comprising:
   a first PMOS transistor, a first pull-up PMOS transistor, and a first pull-down NMOS transistor connected in series between a voltage Vpp terminal and a voltage Vss terminal, the first pull-up PMOS transistor and first pull-down NMOS transistor having a common drain which acts as a first voltage terminal;
   a second PMOS transistor, a second pull-up PMOS transistor, and a second pull-down NMOS transistor connected in series between the voltage Vpp terminal and the voltage Vss terminal and configured symmetrically with respect to the first PMOS transistor, the first pull-up PMOS transistor and the first pull-down NMOS transistor, the second pull-up PMOS transistor and second pull-down NMOS transistor having a common drain which acts as a second voltage terminal;
   a first MOS transistor, having a drain connected to the Vpp terminal, for increasing a level of the second voltage terminal during a level shifting and decreasing a driving capacity of the first pull-up PMOS transistor;
   a second MOS transistor, having a drain connected to the Vpp terminal, for increasing a level of the first voltage terminal during a level shifting and decreasing a driving capacity of the second pull-up PMOS transistor.

2. The circuit of claim 1, wherein said first and second MOS transistors are NMOS transistors.

3. The circuit of claim 1, wherein said first MOS transistor also has a gate connected to a gate of the first PMOS transistor, to a gate of the first pull-down NMOS transistor, and to an input terminal, and a source connected to a gate of the first pull-up PMOS transistor and to the second voltage terminal.

4. The circuit of claim 3, wherein said second MOS transistor also has a gate connected to a gate of the second PMOS transistor, to a gate of the second pull-down NMOS transistor and to an input terminal through an inverter, and a source connected to a gate of the second pull-up PMOS transistor and to the first voltage terminal.

5. A voltage level shifting circuit, comprising:
   a first pull-up PMOS transistor, a first PMOS transistor, and a first pull-down NMOS transistor connected in series between a voltage Vpp terminal and a voltage Vss terminal, the first PMOS transistor and first pull-down NMOS transistor having a common drain which acts as a first voltage terminal;
   a second pull-up PMOS transistor, a second PMOS transistor, and a second pull-down NMOS transistor connected in series between the voltage Vpp terminal and the voltage Vss terminal and configured symmetrically with respect to the first pull-up PMOS transistor, the first PMOS transistor, and the first pull-down NMOS transistor, the second PMOS transistor and second pull-down NMOS transistor having a common train which acts as a second voltage terminal;
   a first MOS transistor, having a drain connected to the Vpp terminal, for increasing a voltage level of the second voltage terminal during a level shifting and decreasing a driving capacity of the first pull-up PMOS transistor; and
   a second MOS transistor having a drain connected to the Vpp terminal, for increasing a voltage level of the first voltage terminal during a level shifting and decreasing a driving capacity of the second pull-up PMOS transistor.

6. The circuit of claim 5, wherein said first and second MOS transistors are NMOS transistors.

7. The circuit of claim 5, wherein said first MOS transistor also has a gate connected to a gate of the first PMOS transistor, to a gate of the first pull-down NMOS transistor, and to an input terminal, and a source connected to a gate of the first pull-up PMOS transistor and to the second voltage terminal.

8. The circuit of claim 7, wherein said second MOS transistor also has a gate connected to a gate of the second PMOS transistor, to a gate of the second pull-down NMOS transistor and to an input terminal through an inverter, and a source connected to a gate of the second pull-up PMOS transistor and to the first terminal.

9. The circuit of claim 5, wherein said first and second MOS transistors each have a threshold voltage which is lower than threshold voltages of the first and second PMOS, pull-down NMOS, and pull-up PMOS transistors.

10. The circuit of claim 5, wherein said second MOS transistor increases the voltage level of the first voltage terminal to a voltage Vdd-Vthl level when an input signal is a voltage Vss level, wherein Vdd is lower than Vpp, and Vthl is a low threshold voltage.

11. The circuit of claim 5, wherein said first MOS transistor increases the voltage level of the second voltage terminal to a voltage Vdd-Vthl level when an input signal is a voltage Vdd level, wherein Vdd is lower than Vpp, and Vthl is a low threshold voltage.

12. The circuit of claim 3, wherein the voltage level at the first voltage terminal is increased to a voltage Vdd-Vthl level and then to a voltage Vpp level when an input signal is a voltage Vss level, wherein Vdd is lower than Vpp, and Vthl is a low threshold voltage.

13. The circuit of claim 5, wherein said voltage level at the second voltage terminal is increased to a voltage Vdd-Vthl level and then to a voltage Vpp level when an input signal is a voltage Vdd level, wherein Vdd is lower than Vpp, and Vthl is a low threshold voltage.

* * * * *